(12) United States Patent
Naoe

(10) Patent No.: US 7,855,035 B2
(45) Date of Patent: Dec. 21, 2010

(54) EXPOSURE MASK, MANUFACTURING METHOD OF ELECTRONIC DEVICE, AND CHECKING METHOD OF EXPOSURE MASK

(75) Inventor: Mitsufumi Naoe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 352 days.

(21) Appl. No.: 11/874,431

(22) Filed: Oct. 18, 2007

(65) Prior Publication Data

US 2008/0096113 A1    Apr. 24, 2008

(30) Foreign Application Priority Data

Oct. 19, 2006    (JP) .............................. 2006-285436

(51) Int. Cl.
G03F 1/00 (2006.01)
G03F 9/00 (2006.01)
H01L 23/544 (2006.01)

(52) U.S. Cl. .............................. 430/5; 430/22; 430/311; 257/797

(58) Field of Classification Search ...................... 430/5, 430/22; 257/797, 510
See application file for complete search history.

(56) References Cited

U.S. PATENT DOCUMENTS

| 4,849,313 | A | * | 7/1989 | Chapman et al. ................ 430/5 |
| 5,521,036 | A | * | 5/1996 | Iwamoto et al. ................ 430/22 |
| 5,723,236 | A | * | 3/1998 | Inoue et al. ..................... 430/5 |
| 2001/0017394 | A1 | * | 8/2001 | Mori et al. ................... 257/510 |
| 2002/0182545 | A1 | * | 12/2002 | Minami et al. ............. 430/311 |
| 2006/0192302 | A1 | * | 8/2006 | Leroux ....................... 257/797 |
| 2006/0222962 | A1 | * | 10/2006 | Chen et al. ..................... 430/5 |

FOREIGN PATENT DOCUMENTS

| JP | 3-18012 A | 1/1991 |
| JP | 5-341499 A | 12/1993 |

* cited by examiner

Primary Examiner—Stephen Rosasco
Assistant Examiner—Rashid Alam
(74) Attorney, Agent, or Firm—Fujitsu Patent Center

(57) ABSTRACT

According to the present invention, provided is a method of manufacturing a electronic device including forming a film over a substrate, performing a photoresist over the film, performing a first exposure by using an exposure mask which includes a scribe region and a inspection mark formed in a first side of the scribe region, and performing a second exposure so that a region that is exposed to the first side in the first exposure is exposed to a second side of the scribe region which is opposite to the first side, wherein, in the second exposure, an exposure light is incident on a region where the inspection mark is projected in the first exposure.

14 Claims, 24 Drawing Sheets

: exposing region of the dummy shot

EXPOSURE MASK, MANUFACTURING METHOD OF ELECTRONIC DEVICE, AND CHECKING METHOD OF EXPOSURE MASK

CROSS-REFERENCE TO RELATED APPLICATIONS

This application is based on and claims priority of Japanese Patent Application No. 2006-285436 filed on Oct. 19, 2006, the entire contents of which are incorporated herein by reference.

BACKGROUND OF THE INVENTION

1. Field of the Invention

It is related to an exposure mask, a manufacturing method of an electronic device, and a checking method of an exposure mask.

2. Description of the Related Art

In a manufacturing process of semiconductor devices such as LSIs, mask pattern formed on a reticle (an exposure mask) is projected with reduced size onto a semiconductor wafer by use of exposure system such as stepper in order to form fine device patterns.

Although mask patterns on a reticle is formed in accordance with device patterns of LSIs, the mask patterns cannot be projected on a semiconductor wafer in predetermined shapes when the mask patterns are deformed.

For this reason, after the reticle is manufactured, it is usually investigated whether the mask patterns are formed at a predetermined accuracy by optically checking inspection marks formed on a reticle.

FIG. 1 is an entire plan view of a reticle provided with the inspection mark according to a conventional example.

The reticle 1 includes four mask patterns 6, each corresponding to four chips, on a transparent substrate 2 such as quartz substrate. Additionally, a light blocking zone 3 is formed so as to surround these mask patterns 6, and a region inside the light blocking zone 3 becomes a shot region that is subjected to projection onto a semiconductor wafer by one time exposure. Note that the light blocking zone 3 is provided for the purpose of preventing a photoresist from being unnecessarily exposed to light that is originated with the outside of the light blocking zone 3.

Then, in a region outside of the light blocking zone 3, L-shaped inspection marks 5 are formed to check whether the abovementioned mask patterns 6 have been formed in designed positions, and cross alignment marks 4 are formed to align the reticle 1 with an exposure system.

Note that all of the abovementioned elements 3 to 6 are formed by patterning a light blocking film made of a chrome film or the like.

However, even though the inspection marks 5 is formed in an outside region of the light blocking zone 3 in the reticle 1 of abovementioned structure, such a phenomenon occurs that the inspection marks are diffracted and projected onto the semiconductor wafer at the time of exposure. Such a phenomenon is called illumination-based flare, and becomes one of factors generating a defect in device patterns of the semiconductor wafer.

Another idea for preventing such illumination-based flare is to form the inspection marks 5 inside the mask patterns 6.

However, because each of the inspection marks 5 has to be formed in a shape that is large to some extent in order to facilitate the checking, there occurs an inconvenience that sizes of the chips become larger as the inspection marks 5 are made larger.

Moreover, if the inspection marks 5 are formed inside the mask patterns 6, dummy patterns corresponding to the inspection marks 5 are inevitably formed on the semiconductor wafer, and a density in a distribution of the device patterns is disturbed by these dummy patterns.

FIGS. 2 to 5 are plan views each provided for describing conditions imposed on a distribution of device patterns such as metal wiring in semiconductor devices.

In an example of FIG. 2, device patterns 11 formed on a semiconductor wafer 10 are formed so that a density of a distribution thereof becomes uniform within a plane. Such a distribution is an ideal distribution of the device patterns 11.

In contrast to this example, in FIGS. 3 to 5, distributions of device patterns are sparse (FIG. 3), dense (FIG. 4), and has a pattern inserted which is different from the other device patterns 11 surrounding the pattern (FIG. 5) in regions A indicated by dotted lines. When the device patterns 11 are distributed with such a nonuniform density, the surface of an interlayer insulating film formed on these device patterns 11 has heights being low in the part where the distribution is sparse, and being high in the part where the distribution is concentrated, whereby a step is generated in the interlayer insulating film.

In order to suppress generation of such a step, it is necessary to make a density of the device patterns 11 within a plane as uniform as possible without forming the inspection marks 5 inside the mask patterns 6. Such a restriction is essential for a layer (a critical layer), such as a gate electrode that needs to be formed with fine work.

On the other hand, in Japanese Patent Application Laid-open Publication No. Hei5-341499, alignment marks are provided in a scribe region of a reticle to form marks on a semiconductor wafer for the purpose of alignment, and protective patterns are provided in portions of the scribe region which face these alignment marks. Portions onto which the alignment marks are projected in an initial exposure are blocked from light by the protective patterns in a subsequent exposure, whereby it is made possible to leave, on the semiconductor wafer, marks corresponding to the alignment marks.

However, if the marks are thus left in the scribe region, burrs are generated from the marks at the time of cutting out semiconductor chips by dicing, and there arises a problem that semiconductor chips to which these burrs are attached are defective.

Note that such alignment marks are also disclosed in Japanese Patent Application Laid-open Publication No. Hei3-018012.

SUMMARY OF THE INVENTION

It is an aspect of the embodiments discussed herein to provide a method of manufacturing an electronic device, including: forming a film over a substrate; forming a photoresist over the film; performing a first exposure by using an exposure mask which includes a scribe region and a inspection mark formed in a first side of the scribe region; and performing a second exposure so that a region that is exposed to the first side in the first exposure is exposed to a second side of the scribe region which is opposite to the first side; wherein, in the second exposure, an exposure light is incident on a region where the inspection mark is projected in the first exposure.

DESCRIPTION OF THE PREFERRED EMBODIMENTS

Hereinbelow, an embodiment of the present invention will be described in detail with reference to the accompanying drawings.

Reticle

Figure 1:
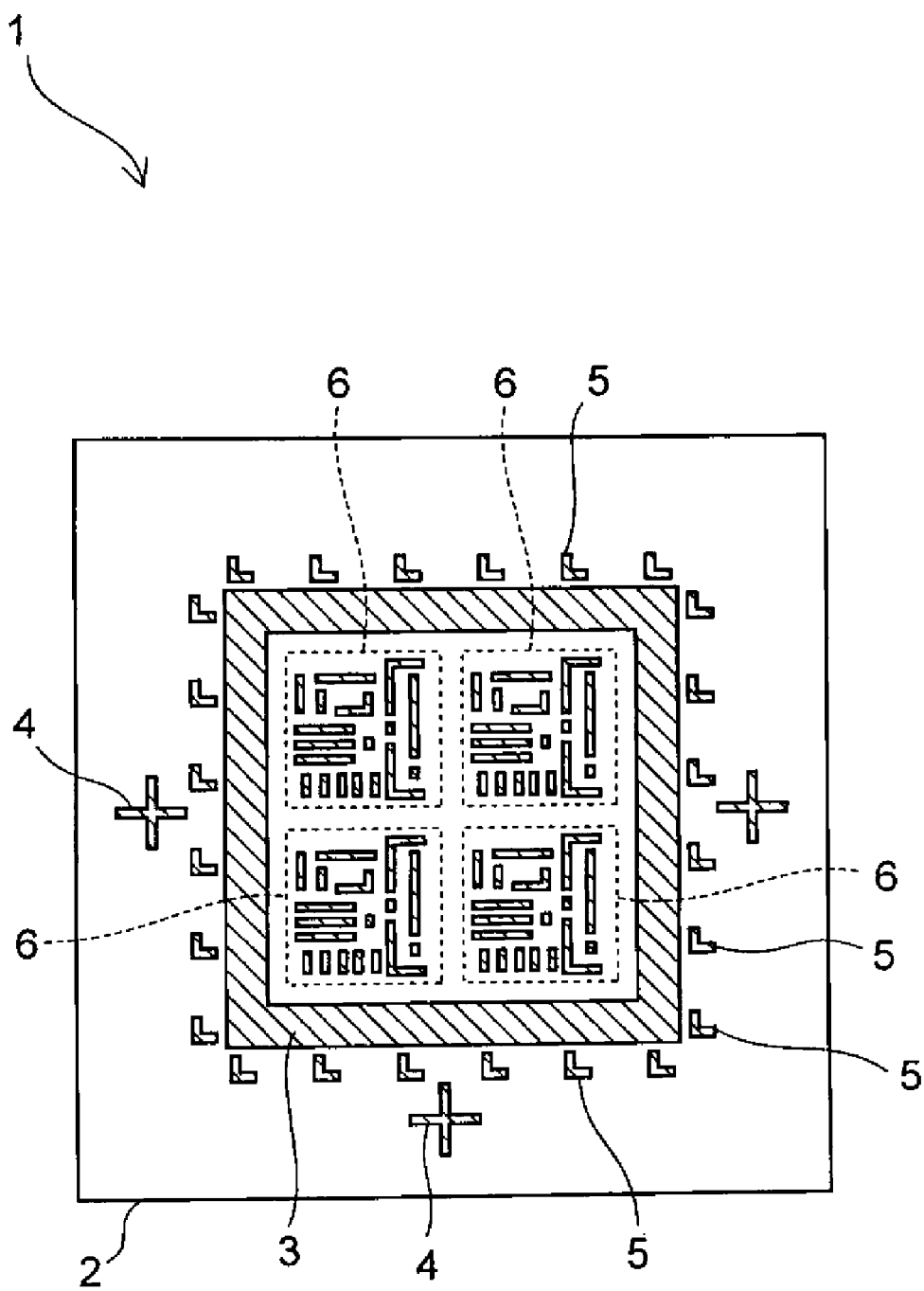
FIG. 1 is an entire plan view of a reticle according to a conventional example.
Figure 2:
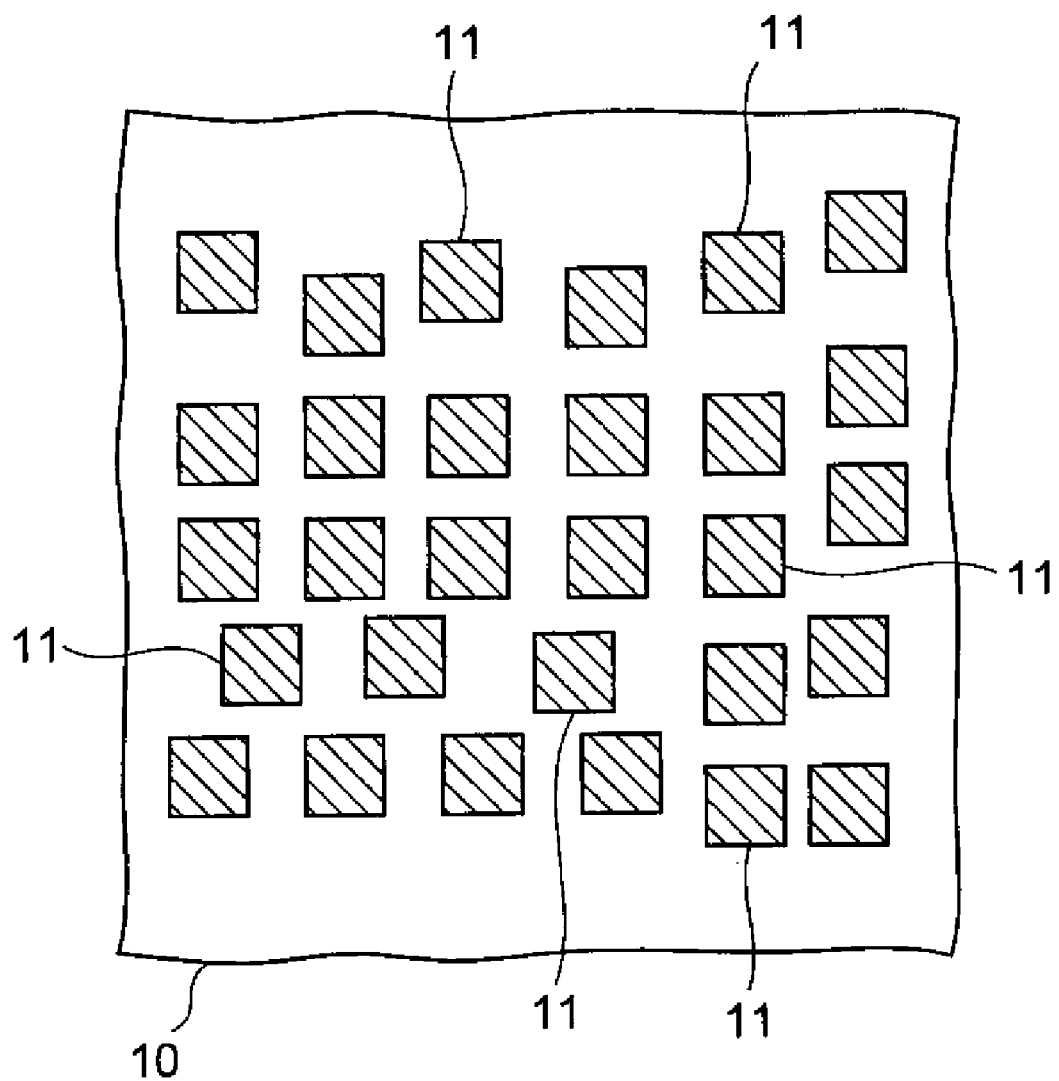
FIG. 2 is a plan view of device patterns arranged so that a density thereof can be uniform within a plane of a wafer.
Figure 3:
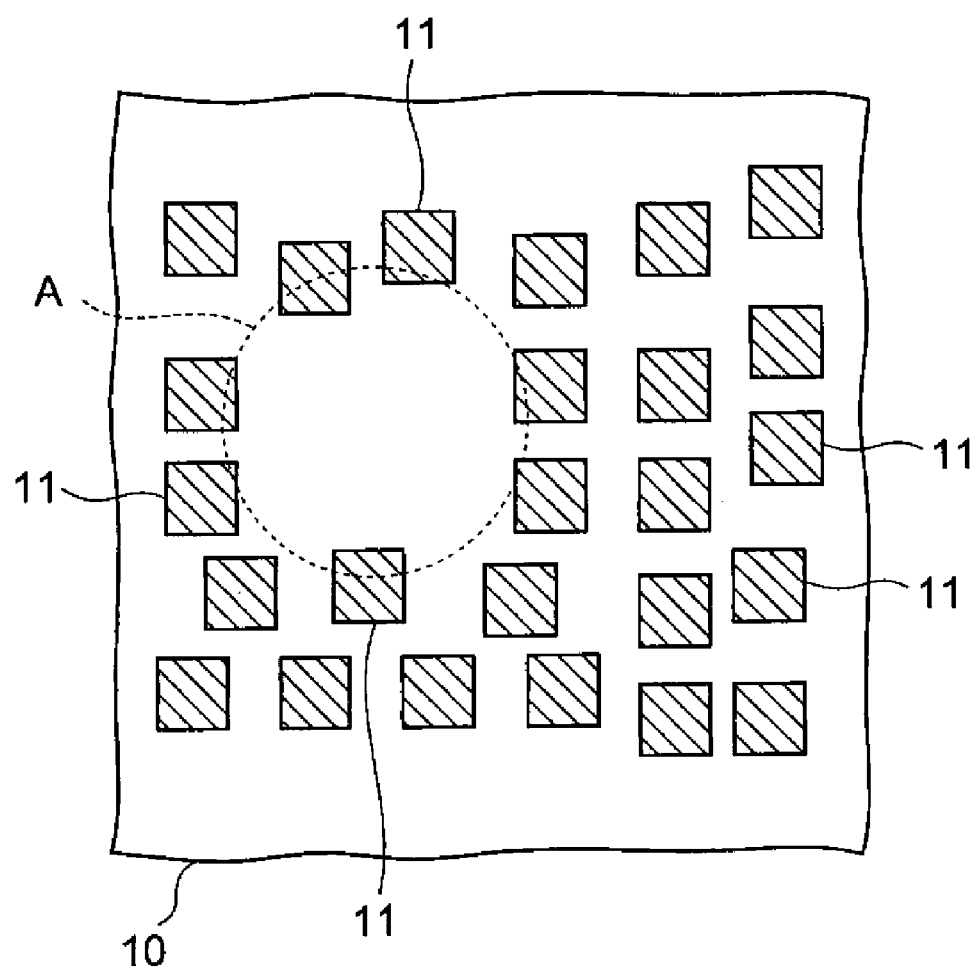
FIG. 3 is a plan view of device patterns whose density is locally sparse within a plane of a wafer.
Figure 4:
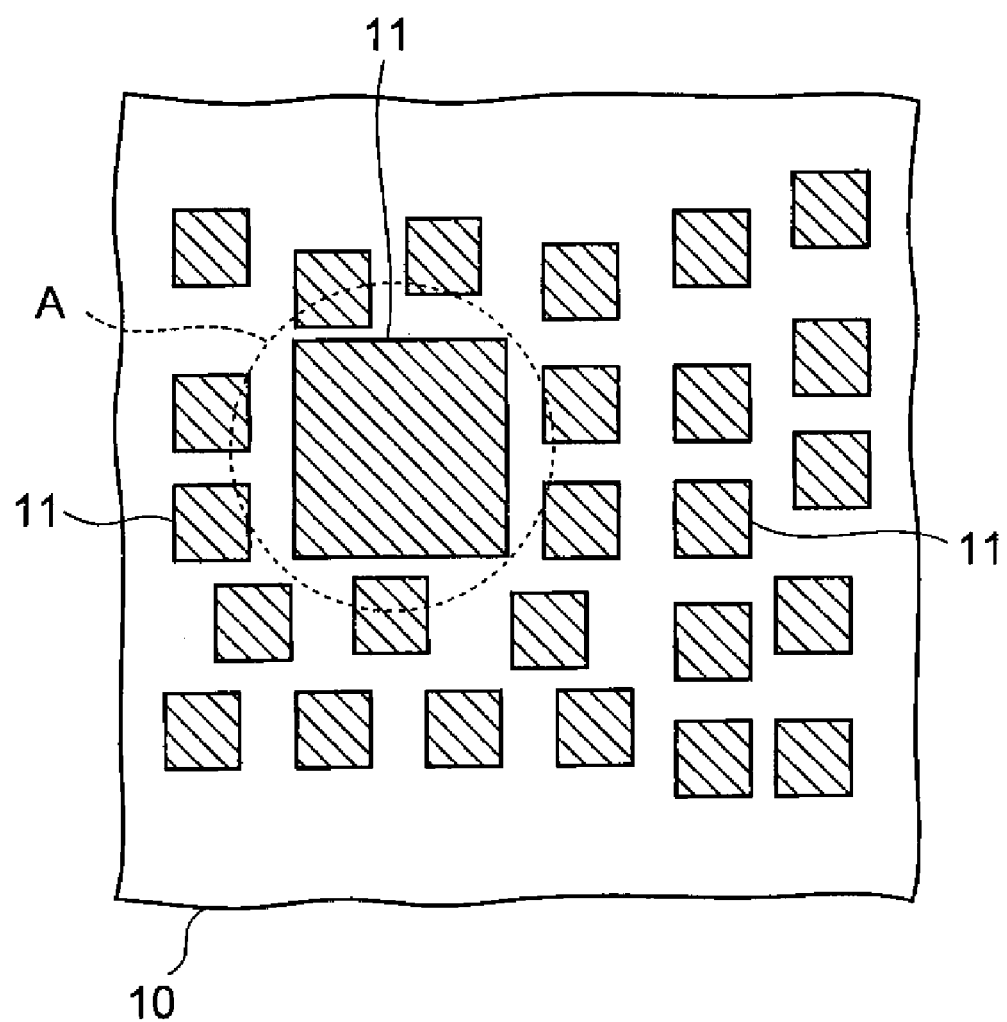
FIG. 4 is a plan view of device patterns whose density is locally concentrated within a plane of a wafer.
Figure 5:
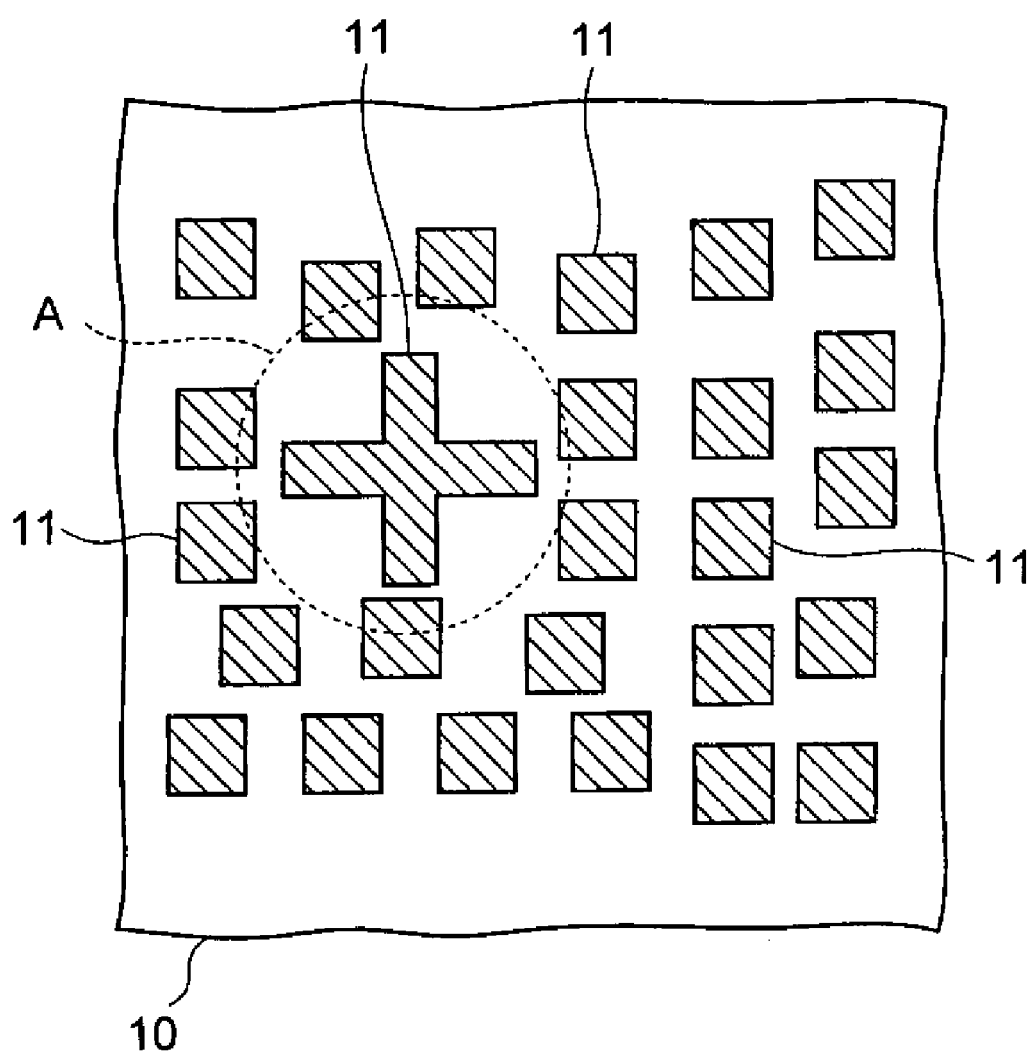
FIG. 5 is a plan view of device patterns in a case where a pattern different from the other patterns is locally inserted among the device patterns within a plane of a wafer.
Figure 6:
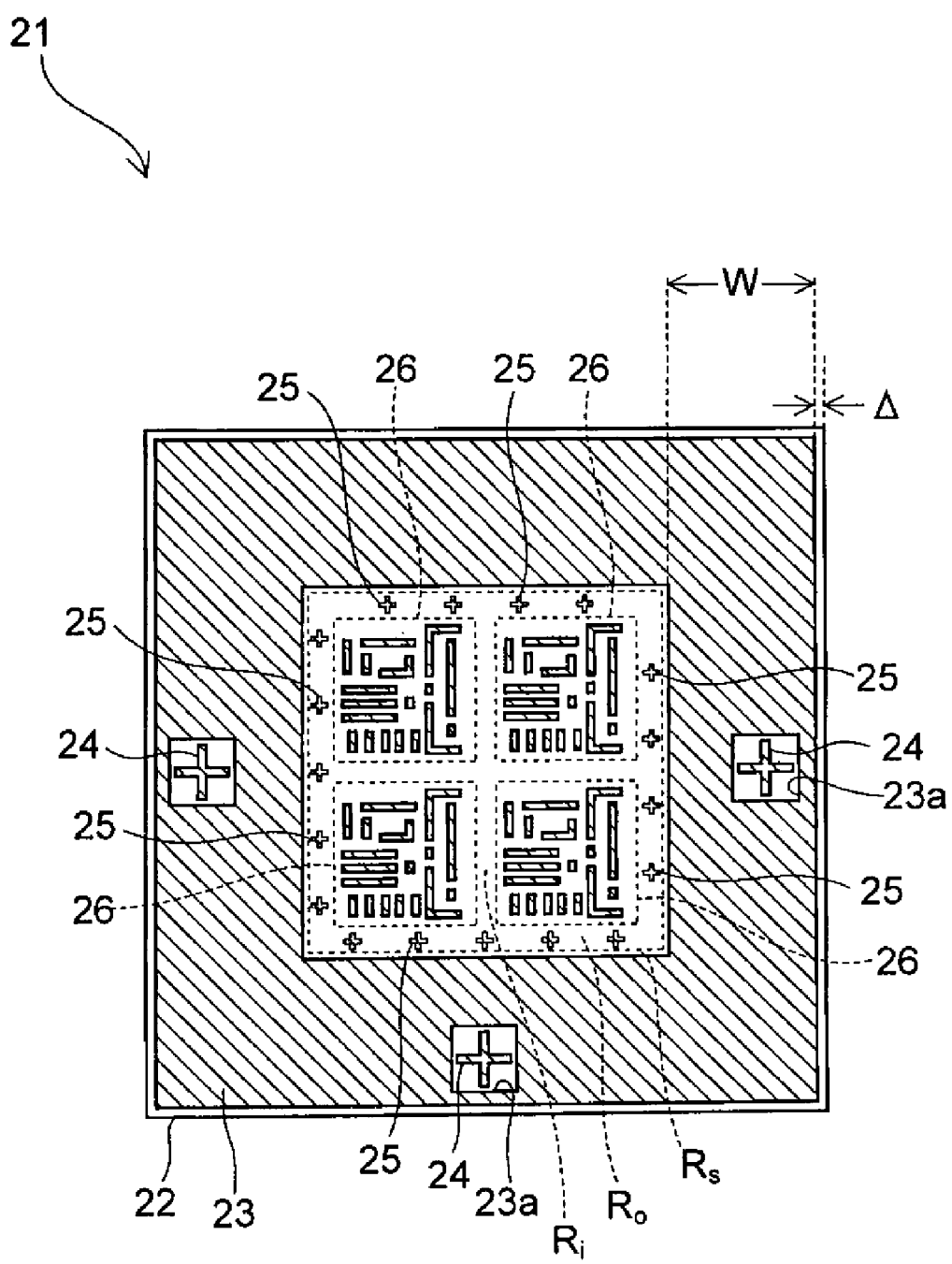
FIG. 6 is an entire plan view of a reticle.

FIG. 6 is an entire plan view of a reticle (an exposure mask) according to the present embodiment embodiment.

This reticle 21 includes a light blocking zone 23 formed by patterning a light blocking film, such as a chrome film, on a transparent substrate 22 made of quartz or the like. The light blocking zone 23 is formed so as to surround a rectangular shot region $R_s$, and also so as to reach the vicinities of edges of the transparent substrate 22.

By thus widening a width W of the light blocking zone 23 to its limit, a flare phenomenon attributable to exposure light passing through a region outside of the light blocking zone 23 can be prevented. Although the width W is not particularly limited, it is about 12 to 16 mm, for example.

However, if the edges of the transparent substrate 22 are completely covered with the light blocking zone 23, the light blocking zone 23 is likely to peel off from the side surface of the transparent substrate 22. Accordingly, it is preferable that the light blocking zone 23 is recessed from the edges of the transparent substrate 22. It is preferable that a recessed distance Δ be, for example, set narrower than a width of a inspection mark 25 which will be described later.

Additionally, apertures 23a are provided in three locations in the light blocking zone 23, and cross alignment marks are formed in regions inside these apertures 23a. When the reticle 21 is set in an exposure system, the reticle 21 is aligned with the exposure system by using these alignment marks as clues.

In the shot region $R_s$, mask patterns 26 corresponding to four semiconductor chips are formed. These mask patterns 26 are also formed by patterning a chrome film as in the case with the light blocking zone 23.

Here, a region, which surrounds the mask patterns 26 and is made by fringing the shot region $R_s$, is called an outer peripheral scribe region $R_o$. On the other hand, a region between the each mask pattern 26 is called an inner scribe region $R_i$.

In the present embodiment, inspection marks 25 used for checking whether the mask patterns 26 are formed in designed positions are provided in this outer peripheral scribe region $R_o$.

Note that planer shapes of the inspection marks 25 are not particularly limited, and that an L-shaped mark may be adopted instead of the cross shape as shown in the drawing.

Figure 7:
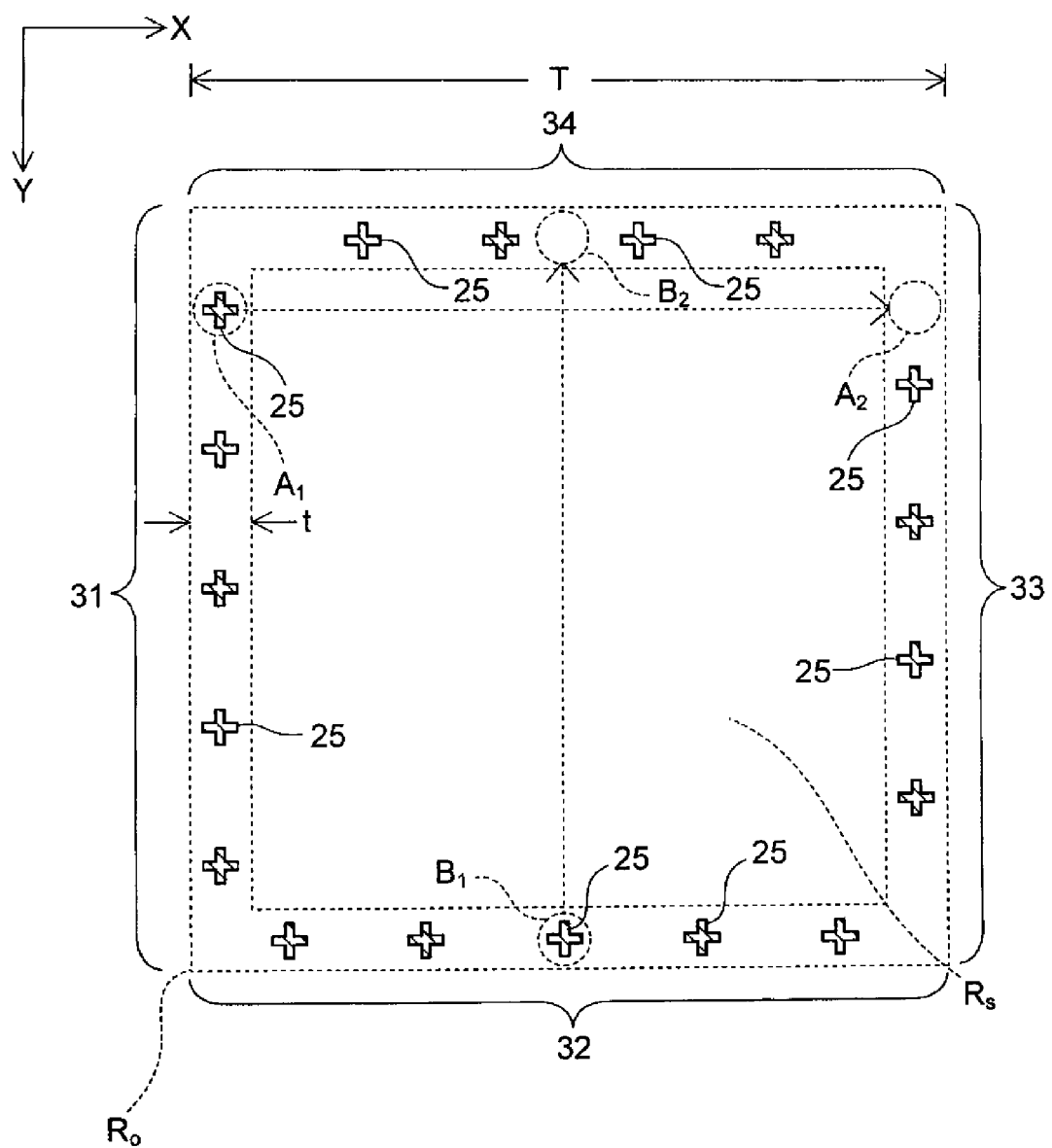
FIG. 7 is a schematic view provided for explaining an arrangement of inspection marks.

FIG. 7 is a schematic view provided for explaining an arrangement of the inspection marks 25.

The number of the inspection marks 25 provided to each of sides 31 to 34 of the outer peripheral scribe region $R_o$ is 5 to 10, and the number of the inspection marks 25 provided to all of these sides is 20 to 40 in total.

These inspection marks 25 are formed so as not to face each other across the shot region $R_s$.

For example, assume that one of the inspection marks 25 which is located at a position $A_1$ on the side 31 is hypothetically subjected to parallel displacement in the X-axis direction by a distance corresponding to the intervals of the shot regions, that is, a distance T–t obtained by subtracting a width t of the outer peripheral scribe region $R_o$ from a width T of the shot region $R_s$. In this case, none of the inspection marks 25 exist at a position $A_2$ that corresponds to the hypothetically displaced inspection mark 25. Likewise, when one of the inspection marks 25 which is located at a position $B_1$ on the side 32 is hypothetically subjected to parallel displacement in the Y-axis direction, none of the inspection marks 25 exist at a position $B_2$.

By adopting such an arrangement of the inspection marks 25, no patterns that block exposure light exist at the positions $A_2$ and $B_2$ in the outer peripheral scribe region $R_o$. Accordingly, the outer peripheral scribe region $R_o$ at these positions $A_2$ and $B_2$ transmits exposure light.

Note that, as long as the inspection marks 25 are arranged in accordance with the above-mentioned rule, pitches between adjacent inspection marks 25 may be uniform, or may be random. Furthermore, there is no need to provide the inspection marks 25 to all of the four sides 31 to 34, and the inspection marks 25 may be provided only to one of these sides, or to two of the sides adjacent to each other.

FIGS. 8 to 11 are enlarged plan views of the inspection marks 25 provided for achieving such an arrangement.

Figure 8:
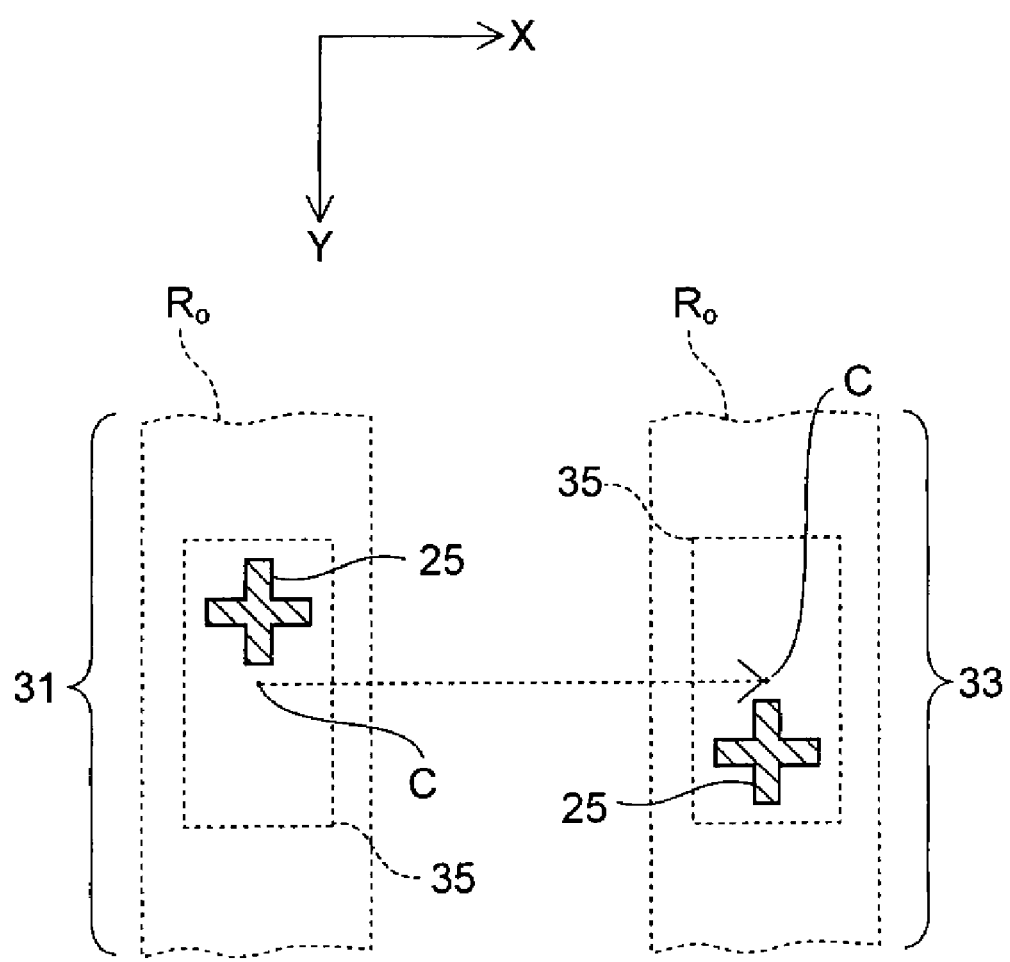
FIGS. 8 to 11 are enlarged plan views of the inspection marks.

In an example of FIG. 8, a rectangular virtual frame 35 enclosing the inspection mark 25 on the side 31 is provided. Note that the virtual frame 35 is formed for the sake of convenience in a designing phase of the inspection marks 25, and is not formed on the actual reticle. Additionally, only one inspection mark 25 is arranged inside the virtual frame 35, and a plurality of the inspection marks 25 are not arranged inside the virtual frame 35.

Then, a mark obtained by rotating the virtual frame 35 by 180 degrees about the center C of the virtual frame 35 is subjected to a parallel displacement to the side 33 that opposes to the side 31, and the thus displaced mark is provided as another inspection mark 25.

At this time, when the inspection mark 25 is arranged in any one of the upper half portion and the lower half portion of the virtual frame 35, the inspection marks 25 on the sides 31 and 33 do not face each other.

Figure 9:
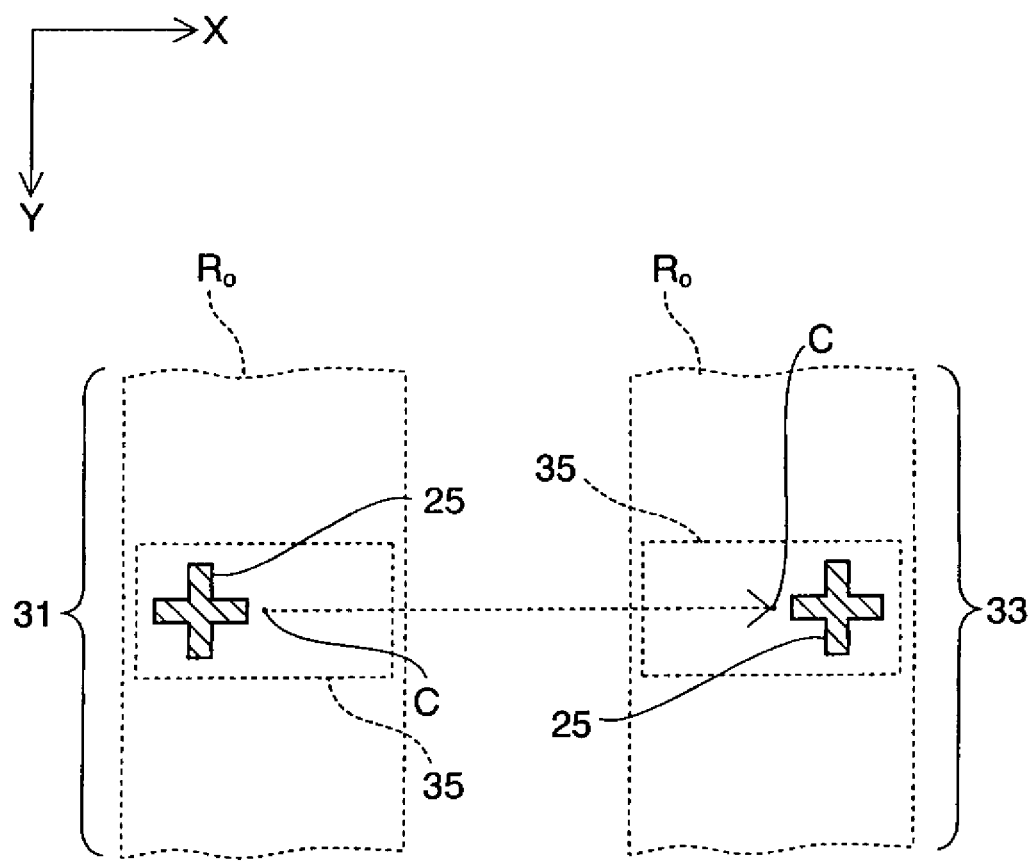

No that, although the long sides of the virtual frame 35 are arranged parallel to the sides 31 and 33 in the example of FIG. 8, the short sides of the virtual frame 35 may be arranged parallel to the sides 31 and 33 as shown in FIG. 9.

Figure 10:
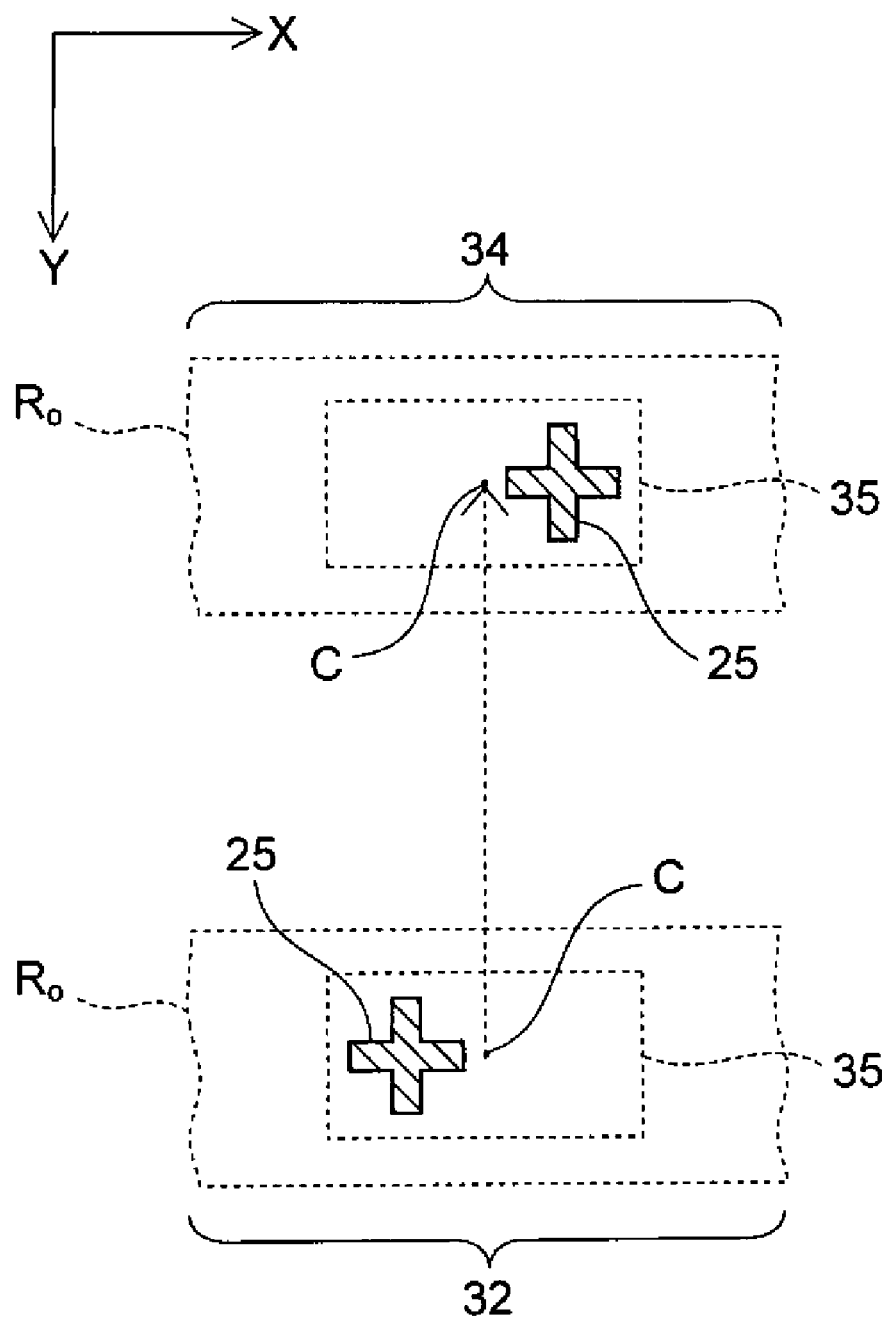

Likewise, in an example of FIG. 10, the marks 25 on the sides 32 and 34 are provided not to face each other. Such an arrangement can be accomplished by providing a mark, which is obtained by rotting another mark on an another side about the center C, on one side.

Figure 11:
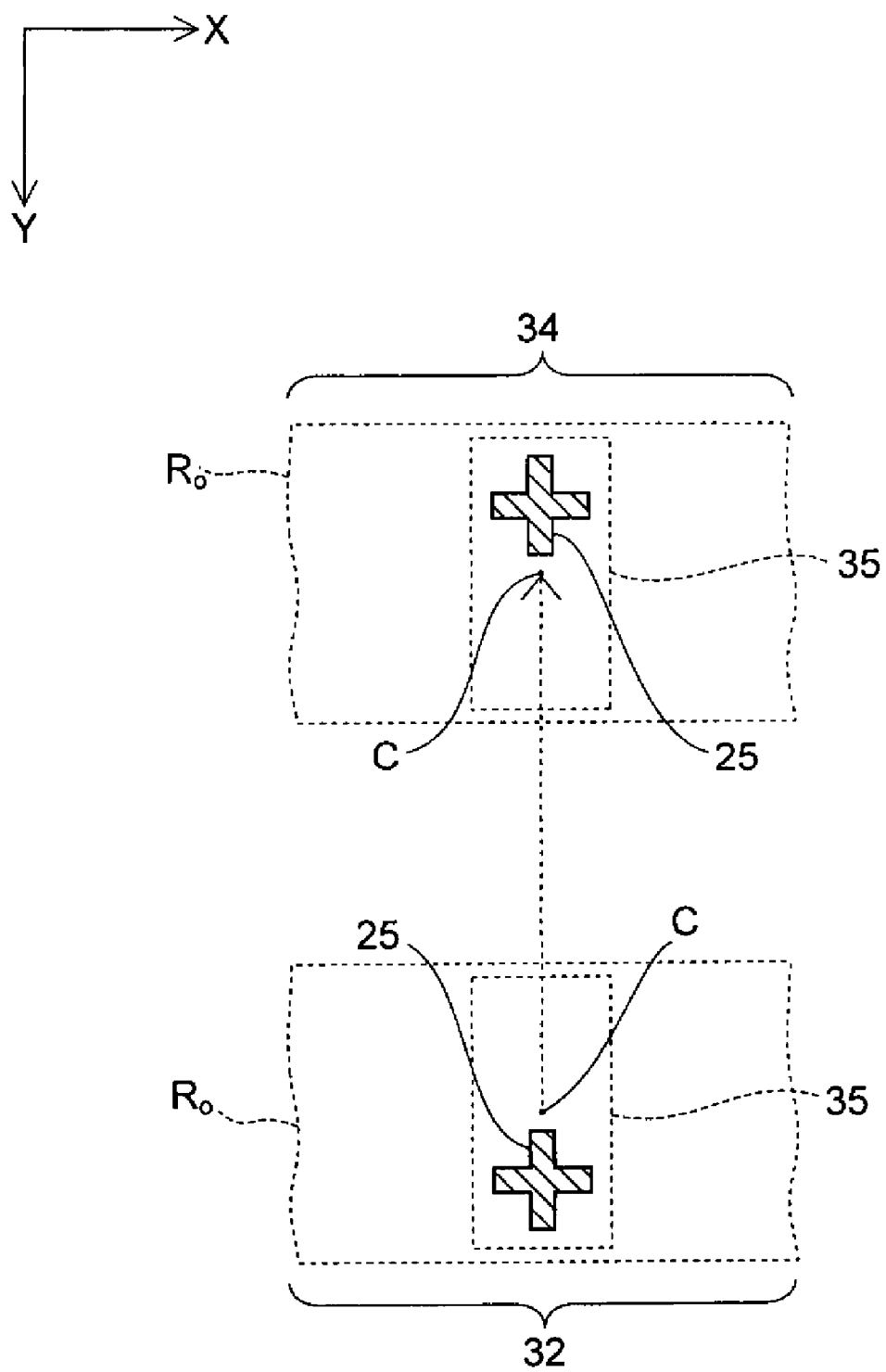

Furthermore, as shown in FIG. 11, the virtual frames 35 and the inspection marks 25 may be arranged so that the short sides of the virtual frames 35 is made parallel to the sides 32 and 34.

Exposure Method

Next, a manufacturing method of an electronic device using the abovementioned reticle 22 will be described.

FIGS. 12 to 15 are plan views provided for explaining the manufacturing method of an electronic device according to the present embodiment.

Figure 12:
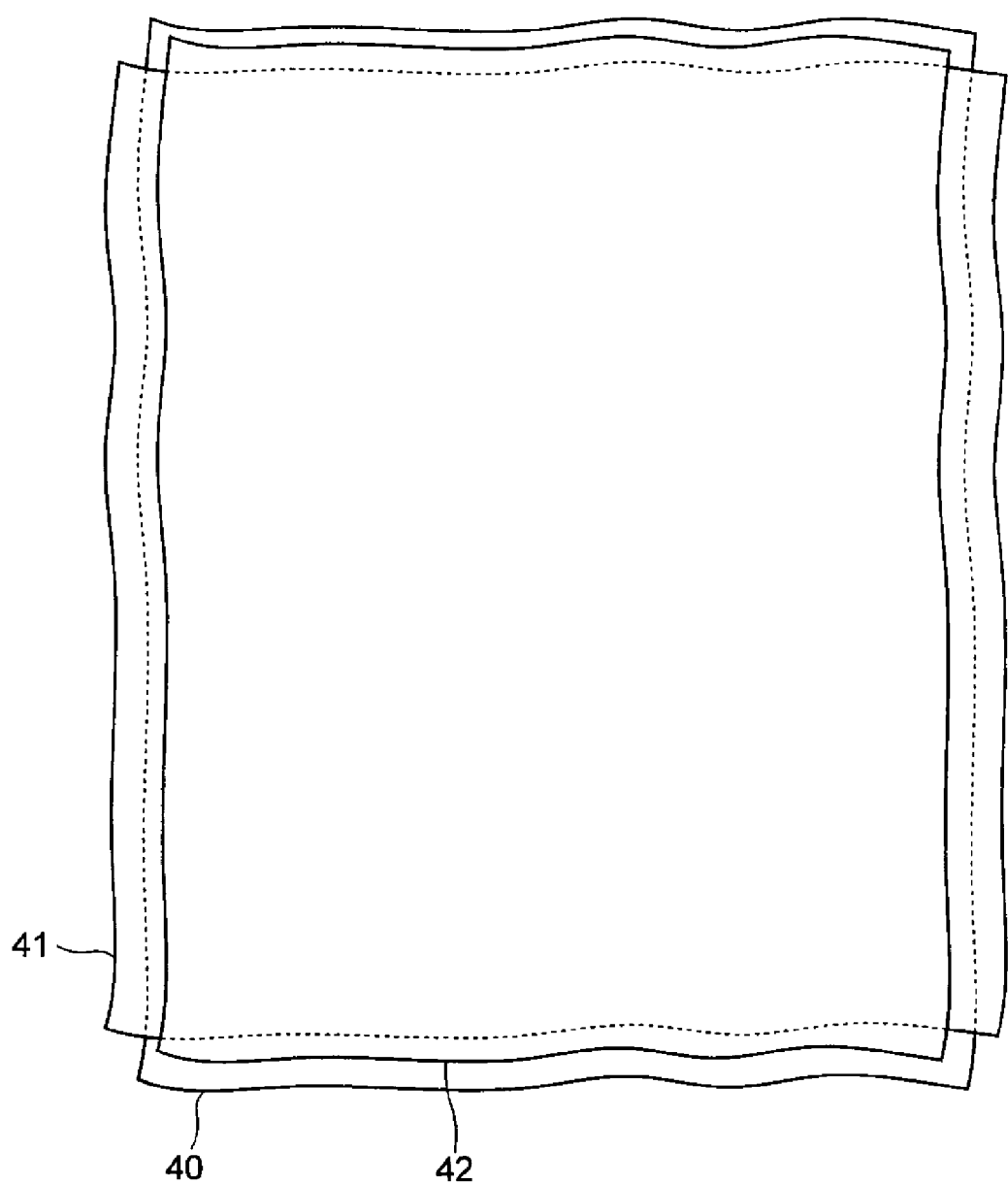
FIGS. 12 to 15 are plan views provided for explaining a manufacturing method of an electronic device.

Firstly, as shown in FIG. 12, a film 41, which will be subjected to patterning is formed on a silicon substrate 40. The film 41 is, for example, an aluminum film used for wiring, and formed by a sputtering method. Then, a positive photoresist 42 is applied on this film 41 by a spin coating method.

Figure 13:
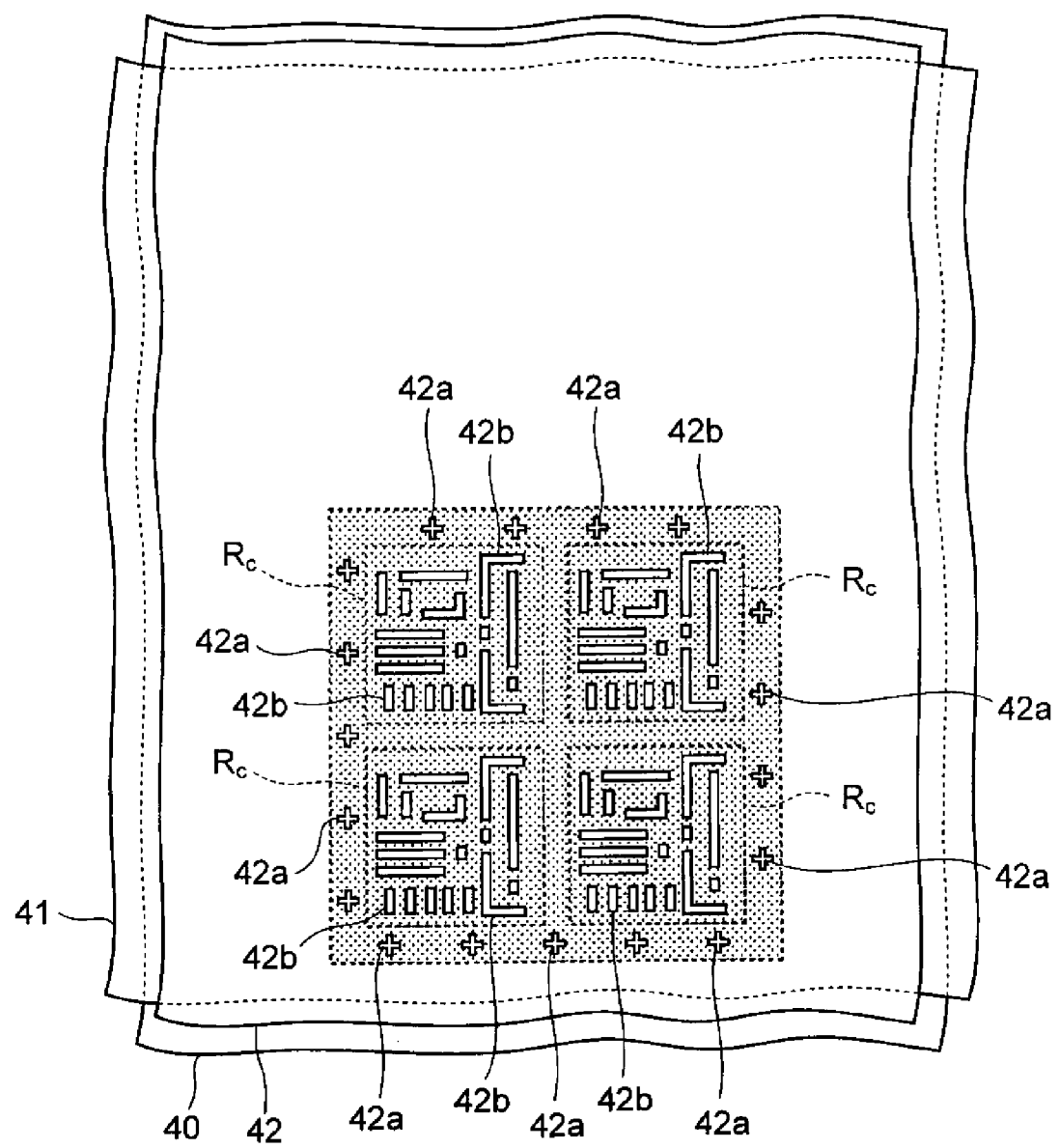

Next, as shown in FIG. 13, after the silicon substrate 40 is mounted on a stage of an unillustrated exposure system such as a stepper, exposure light is caused to transmit the shot region $R_s$ of the reticle 22 that the exposure system have, whereby the photoresist 42 in a region including a plurality of chip regions $R_c$ is exposed by one shot. Note that, although the exposure light used here is not particularly limited, KrF laser light is used for example.

In this exposure, the check patterns 25 and the mask patterns 6 of the reticle 22 are projected onto the photoresist 42, and portions of the photoresist 42 onto which these patterns are not projected are exposed in the shot region $R_s$. On the other hand, portions of the photoresist 42 onto which the check patterns 25 and the mask patterns 26 are projected become first unexposed portions 42a and second unexposed portions 42b, respectively.

Here, as is described with reference to FIG. 6, because the light blocking zone 23 of the reticle 21 is formed so as to reach the vicinities of the edges of the transparent substrate 22, occurrence of illumination-based flare attributable to exposure light having passed through a region outside the light blocking zone 23 can be prevented, whereby it is made possible to suppress unnecessary exposure of the photoresist 42 resulting from the flare.

Figure 14:
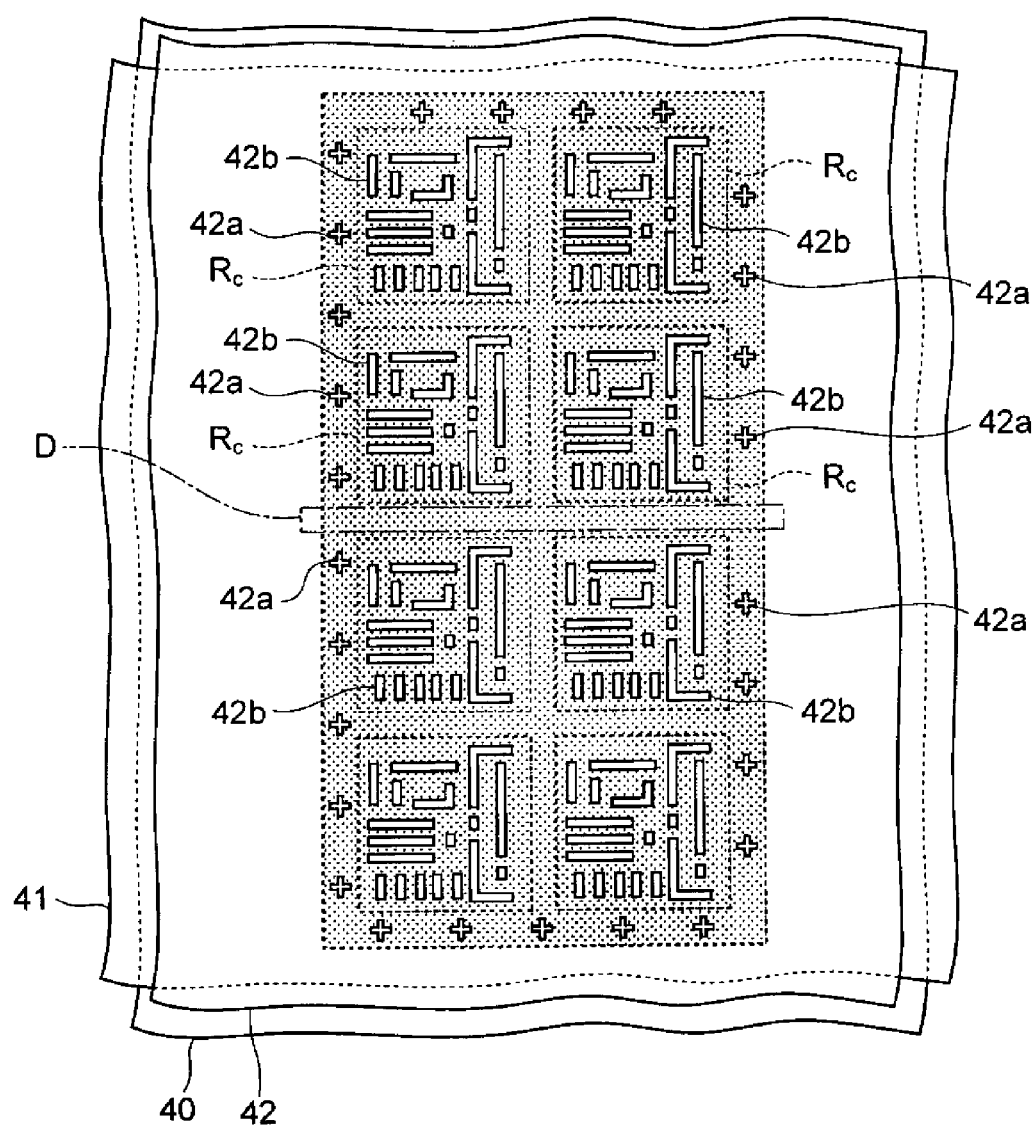

Subsequently, as shown in FIG. 14, after the stage of the exposure system is moved by a distance corresponding to the shot intervals, the photoresist is exposed again to light by one shot, whereby portions of the photoresist 42 which correspond to the check patterns 25 and the mask patterns 26 are set as first unexposed portions 42a and second unexposed portions 42b, respectively.

Here, in a region D shown in FIG. 14, the photoresist 42 is doubly exposed because the outer peripheral scribe regions $R_o$ in the previous exposure and in the current exposure overlap each other.

In addition, as has been described with reference to FIG. 7, because the inspection marks 25 are arranged so that the marks 25 locating on the mutually opposite sides do not face each other, the first unexposed portions 42a formed in the previous exposure are exposed to light in the current exposure, and are thereby deleted. Accordingly, none of the unexposed portions remain in a doubly exposed portion of the photoresist 42 that corresponds to the outer peripheral scribe regions $R_O$.

Thus, in the present embodiment, silicon substrate 40 is moved every time an exposure is performed, in a manner that the portion of the photoresist 42, which corresponds to one side of the outer scribe region $R_O$, is doubly exposed by projecting the mask patterns 26 (see FIG. 6). Thus, the photoresist 42 in a plurality of the chip regions $R_c$ is sequentially exposed.

Figure 15:
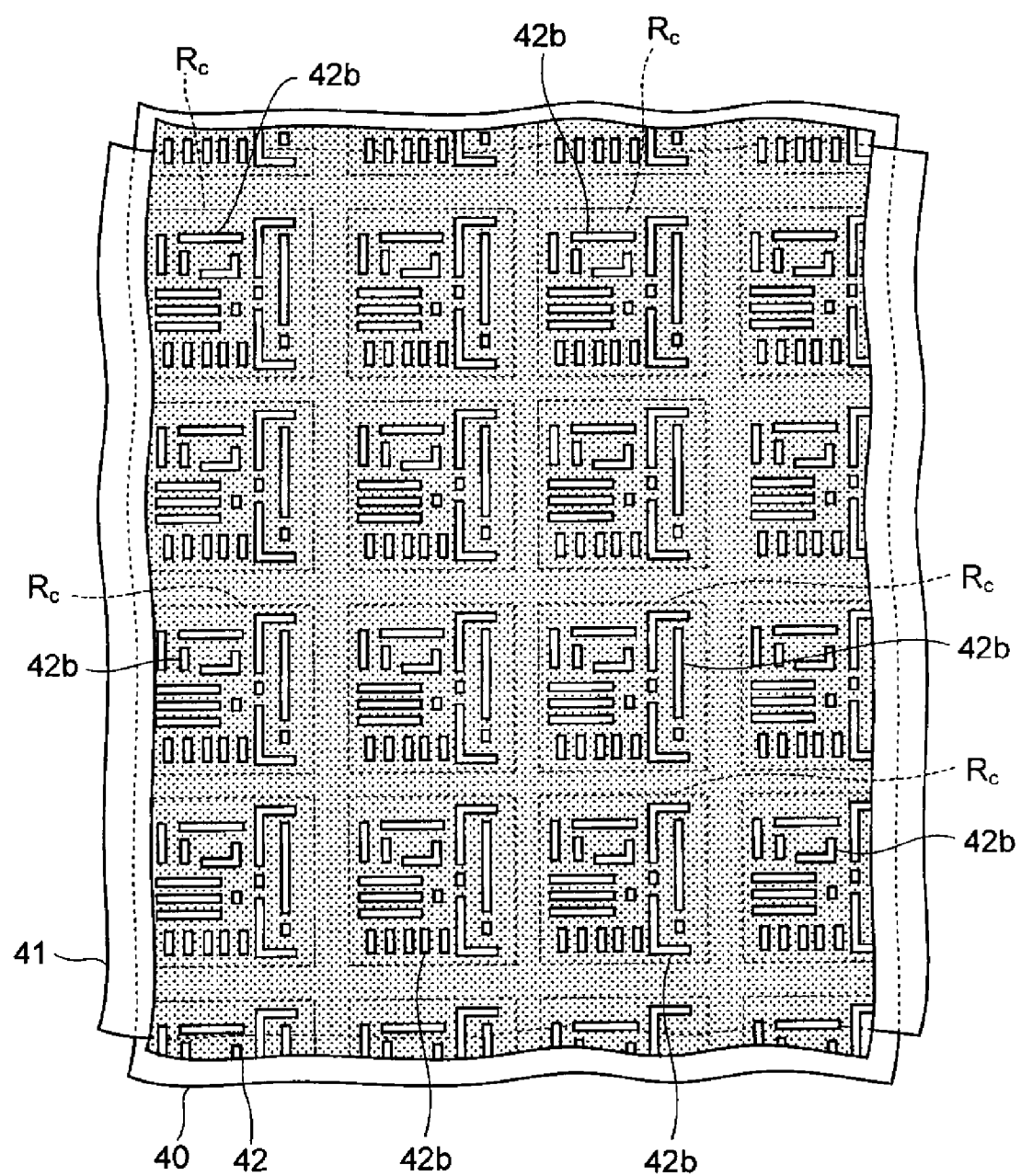

FIG. 15 is an enlarged plan view after completion of exposures for all of the chip regions $R_c$.

As shown in this drawing, all of the first unexposed portions 42a corresponding to the inspection marks 25 are all deleted by doubly exposing the portions of the photoresist 42 which correspond to the outer peripheral scribe regions $R_c$.

Figure 16:
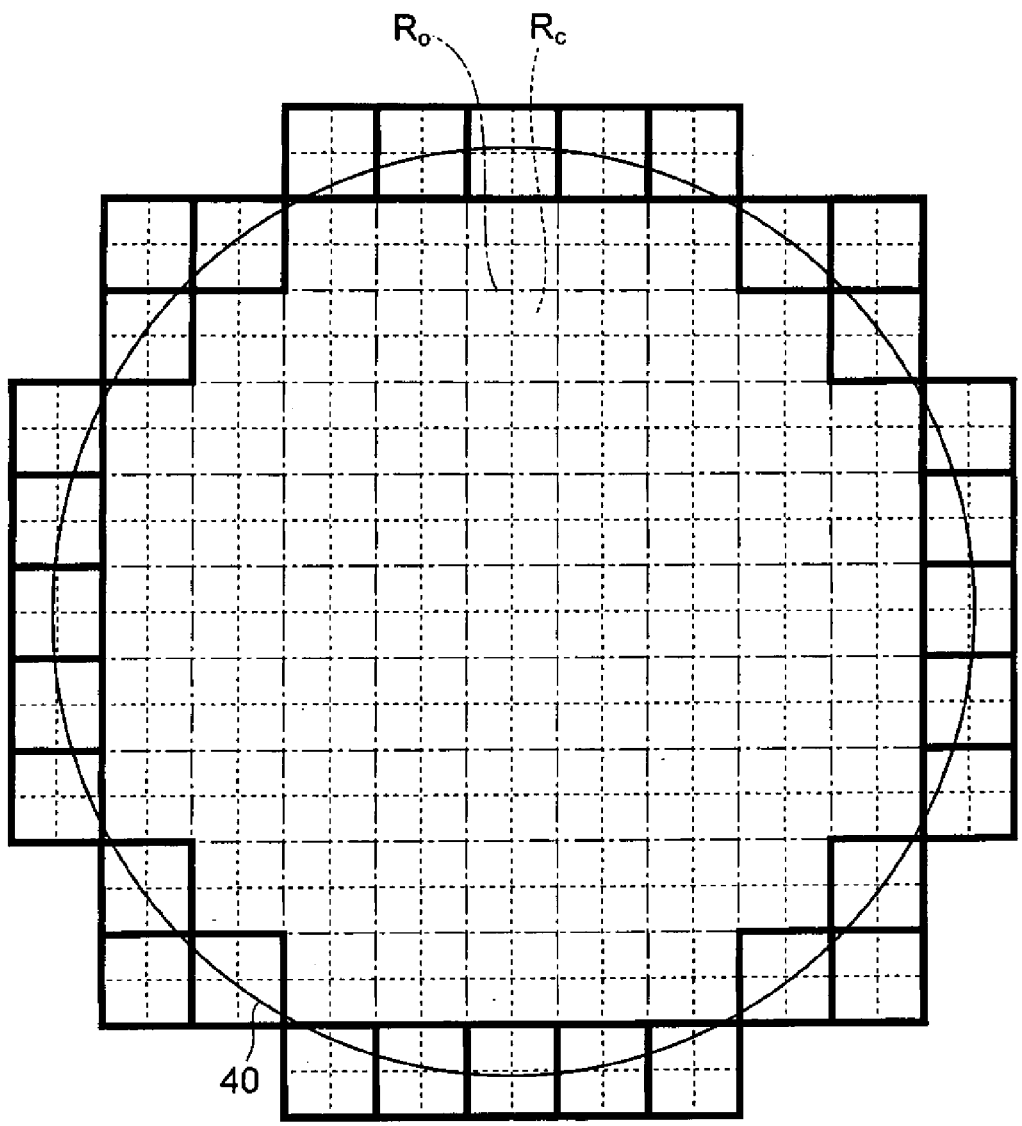
FIG. 16 is an entire plan view of a silicon substrate after the exposures completed.
Figure 16:
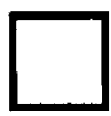

FIG. 16 is an entire plan view of the silicon substrate 40 after the exposures are completed.

As shown in this drawing, at the rim of the silicon substrate 40 from which chips cannot be cut out, an exposure called a "dummy shot" is performed so that a part of the shot region $R_s$ overreaches the substrate 40. By performing such dummy shots, the outer peripheral scribe regions $R_o$ are also doubly exposed at the rim of the silicon substrate 40. Thus, in an entire region of the photoresist 42, it is made possible to delete the first unexposed portions 42a corresponding to the inspection marks 25.

Steps subsequent to the above steps will be described with reference to FIGS. 17 to 20.

The photoresist 42 applied by the spin coating method as mentioned above is thicker at the rim of the silicon substrate 40 than in the other portion. Accordingly, if the photoresist 42 is developed in this state, residues of the photoresist may possibly be generated at the rim of the silicon substrate 40.

Figure 17:
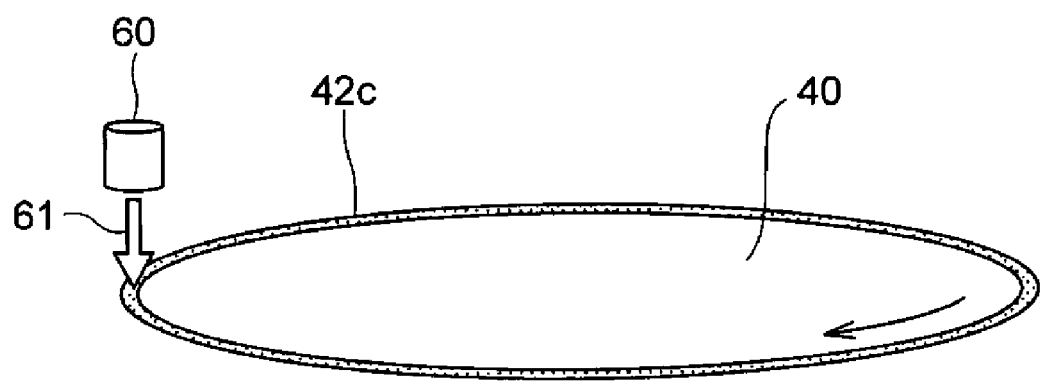
FIG. 17 is a perspective view showing a method of exposing a photoresist in a rim of the silicon substrate.

For the purpose of preventing such generation of the residues, as shown in FIG. 17, rim of the silicon substrate 40 is irradiated with a laser light 61 emitted from the laser light source 60, while rotating the silicon substrate 40 for which the above exposures are finished. Thus, a portion of the photoresist, to which the laser light 61 is irradiated, is completely exposed and a marginal exposed portion 42c is formed.

Figure 18:
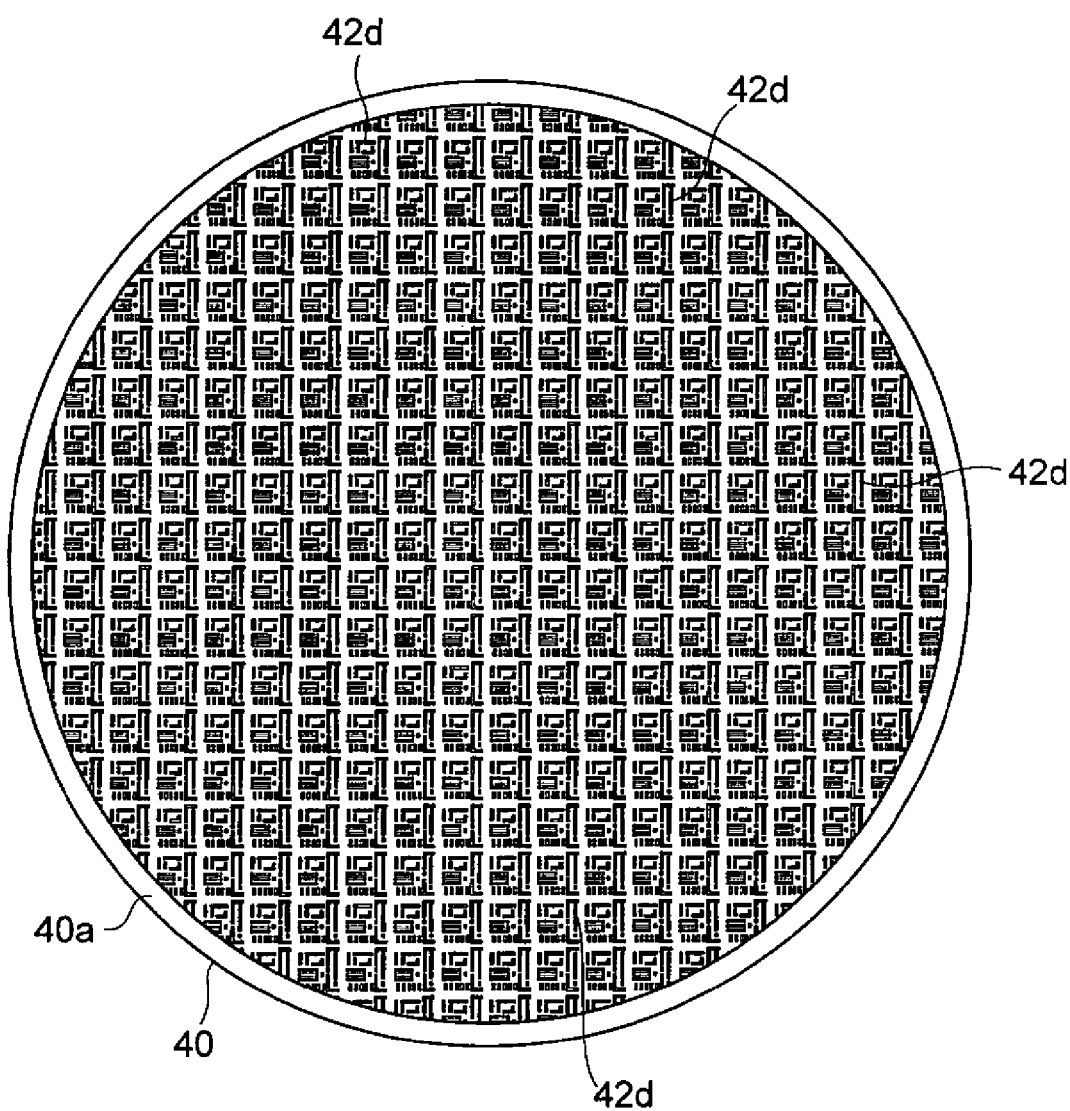
FIG. 18 is an entire plan view of the silicon substrate after resist patterns are formed thereon.

Thereafter, as shown in an entire plan view of FIG. 18, a resist pattern 42d is formed by developing the photoresist 42. Because the rim 40a of the silicon substrate 40 is irradiated with the laser light as described above, photoresist 42 at the rim 40a is completely removed by the development. Therefore, residues of the photoresist 42 are not generated, so that generation of defects in device patterns due to the resist residues reattaching to the silicon substrate 40 can be suppressed.

Figure 19:
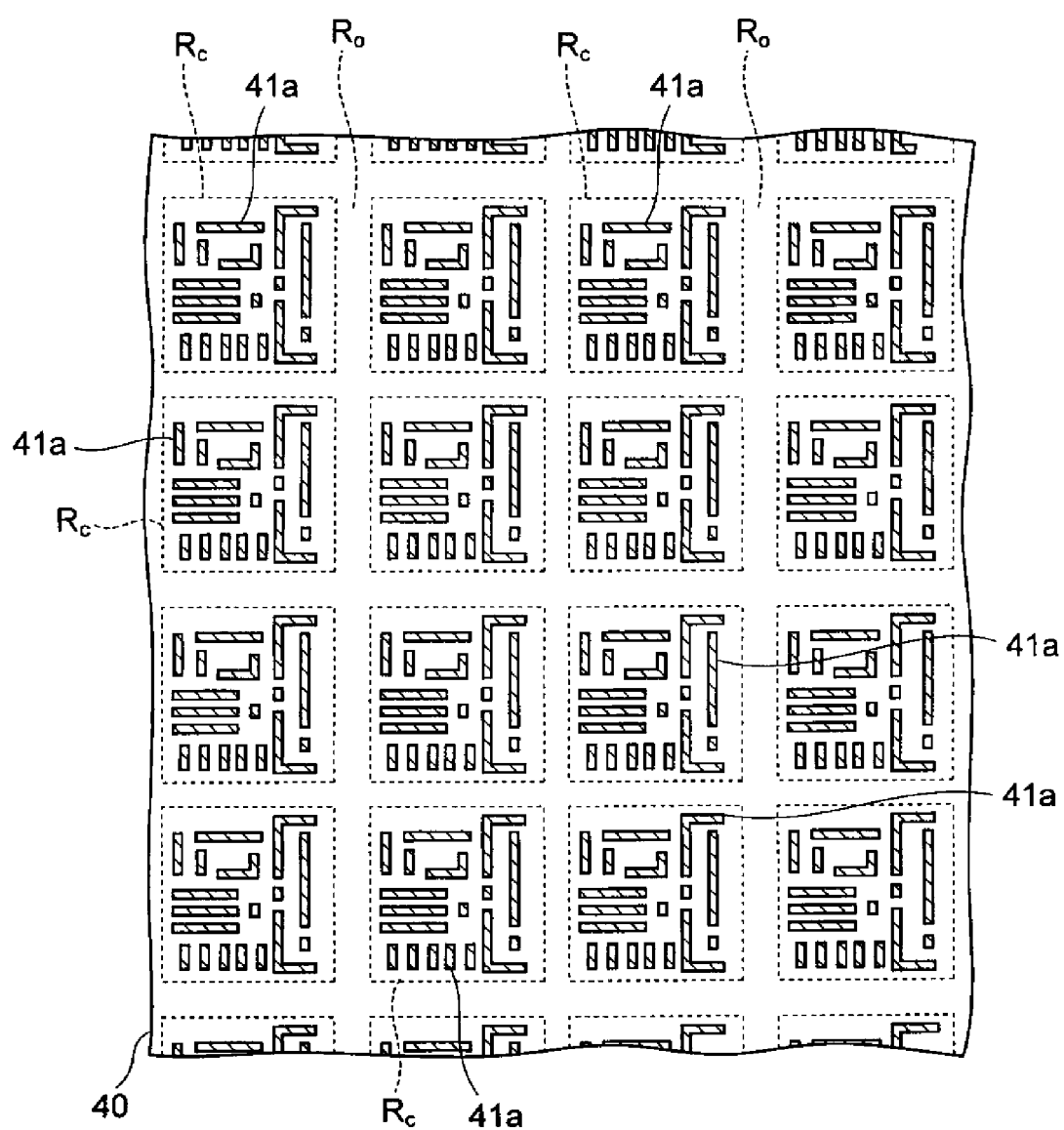
FIG. 19 is an enlarged plan view of the silicon substrate after device patterns are formed thereon.

Next, the film 41 (not shown in FIG. 18) is dry-etched by using the resist patterns 42d as an etching mask, and the resist patterns 42d are removed thereafter. Thereby, as shown in FIG. 19, unetched portions of the film 41 are left as device patterns 41a.

As is described in the above, because the first unexposed portions 42a corresponding to the inspection marks 25 are deleted by the double exposure, no resist patterns remain in the outer peripheral scribe regions $R_o$ on the silicon substrate 40, so that film residues of the film 41 corresponding to the inspection marks 25 are not formed in the outer peripheral scribe regions $R_o$.

Moreover, because the inspection marks 25 are provided in the outer peripheral scribe regions $R_o$, a density of the mask patterns 26 formed inside the outer peripheral scribe region $R_o$ is not affected by the inspection marks 25, so that the device patterns 41a corresponding to the mask patterns 25 can be formed on the silicon substrate 40 at a predetermined density.

Figure 20:
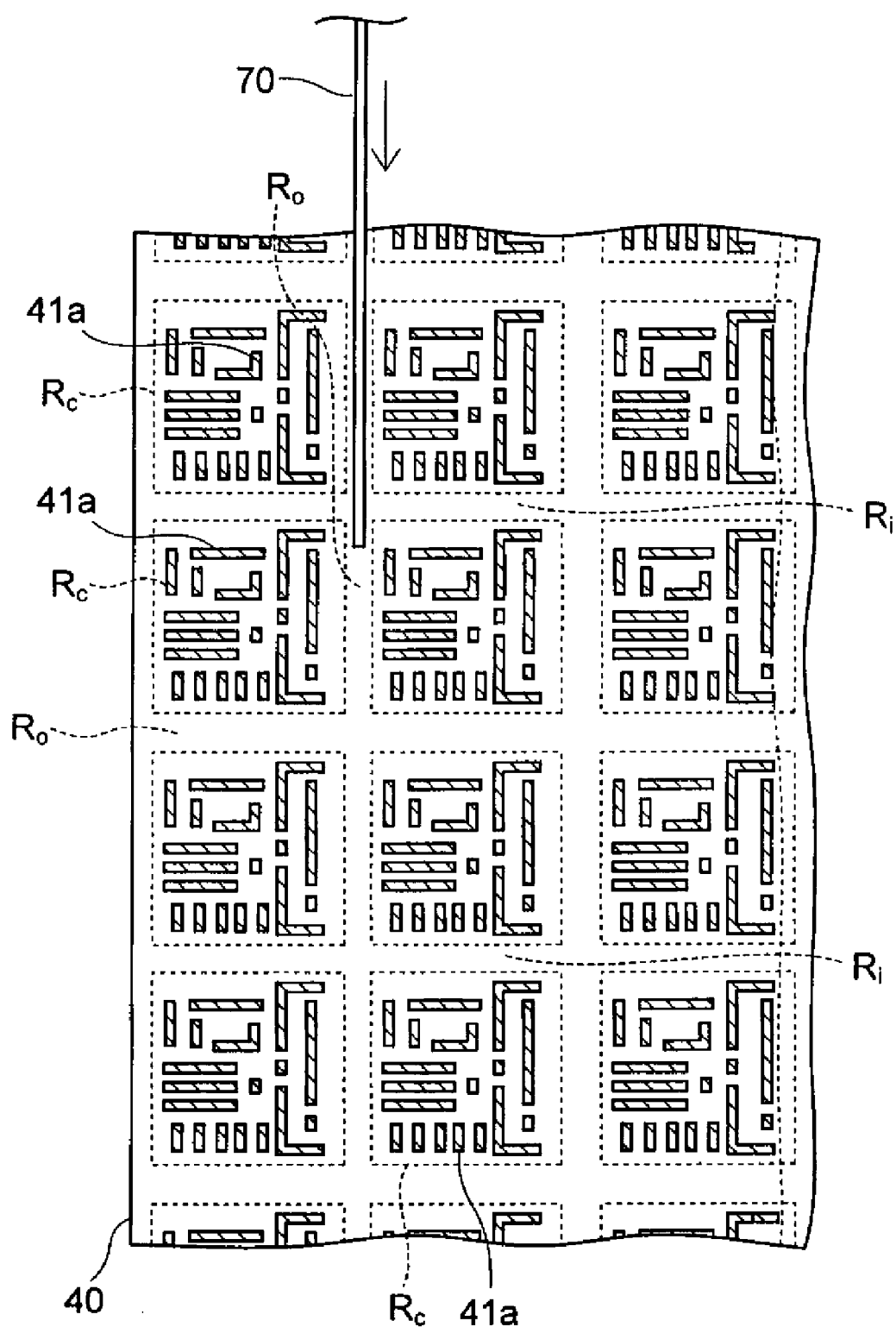
FIG. 20 is an enlarged plan view of the silicon substrate during the dicing.

Subsequently, as shown in FIG. 20, the silicon substrate 40 is diced along the outer peripheral scribe regions $R_o$ and along the inner scribe regions $R_i$ by using a dicing saw 70, and semiconductor chips are taken out by making the silicon substrate 40 into pieces each corresponding to a chip region.

At this time, because there are no film residues of the film 41 in the outer peripheral scribe regions $R_o$ as mentioned above, the dicing saw 70 does not cut film residues, and burrs attributable to film residues are not generated. As a result, defects of the semiconductor chips occurring as a result of reattachment of the burrs to the silicon substrate 40 can be prevented, whereby a yield of the semiconductor chips can be increased.

By these steps, main steps of the manufacturing method of an electronic device according to the present embodiment are completed.

In the abovementioned embodiment, as shown in FIG. 6, the inspection marks 25 formed in the outer peripheral regions $R_o$ are arranged so that they do not face each other on the mutually opposite sides.

Therefore, by performing exposures so that portions of the photoresist 42 which correspond to the outer peripheral scribe regions $R_0$ are doubly exposed as shown in FIG. 14, the first unexposed portions 42a corresponding to the inspection marks 25 can be deleted, whereby it becomes possible to expose all of portions of the photoresist 42 in the outer peripheral scribe regions $R_0$.

Thus, the resist does not remain in the outer peripheral scribe regions $R_o$ even after developing the photoresist 40, and hence the film 41 in the outer peripheral scribe regions $R_o$ can be completely removed by etching. Accordingly, burrs attributable to film residues are not generated, and the semiconductor chips are prevented from becoming defective due to the reattachment of the burrs to the silicon substrate 40.

Note that, although the silicon substrate 40 is used as a substrate subjected to the dicing in the above description, a quartz substrate which is used in a liquid crystal display apparatus or a magnetic recording medium may be used.

Checking Method

Next, a checking method of the above-mentioned reticle 22 will be described with reference to FIGS. 21 and 22.

Figure 21:
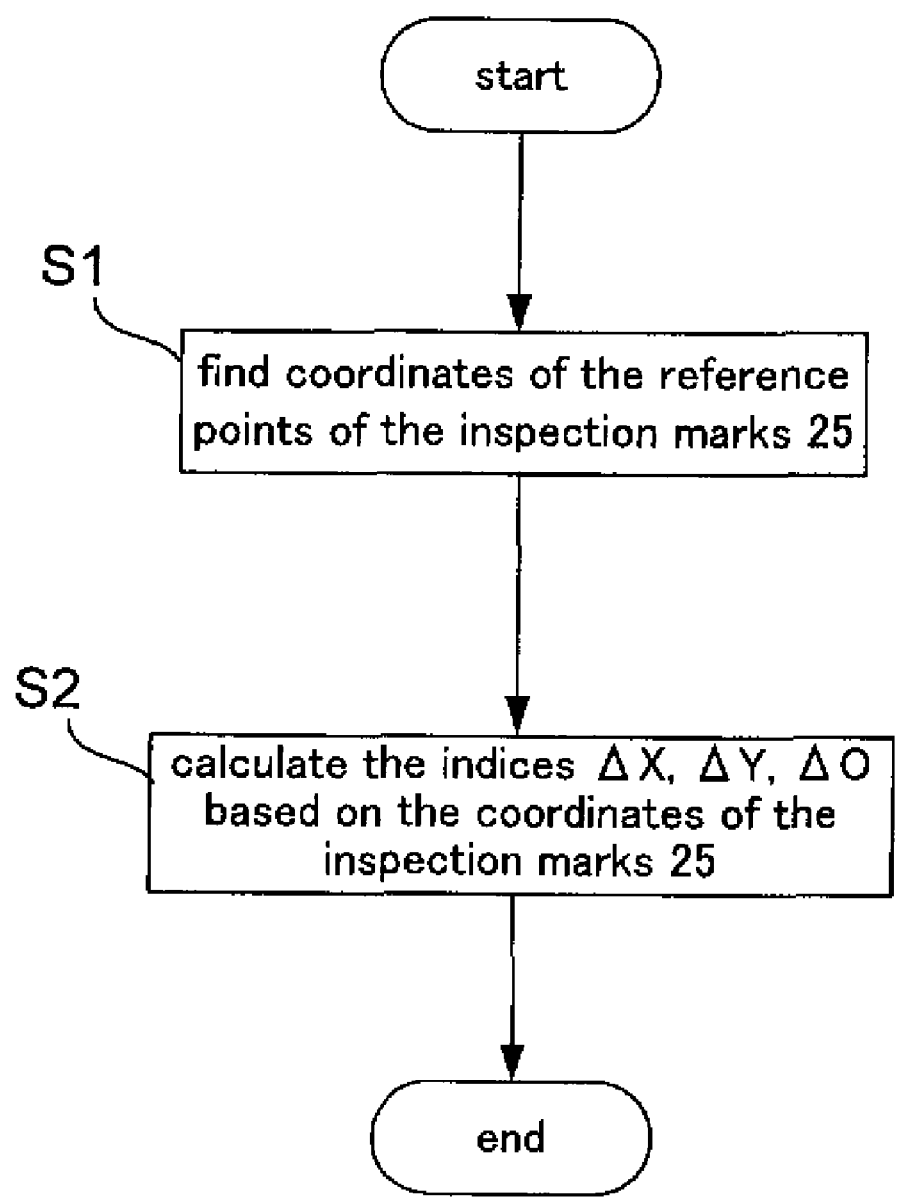
FIG. 21 is a flowchart of a checking method of a reticle.
Figure 22:
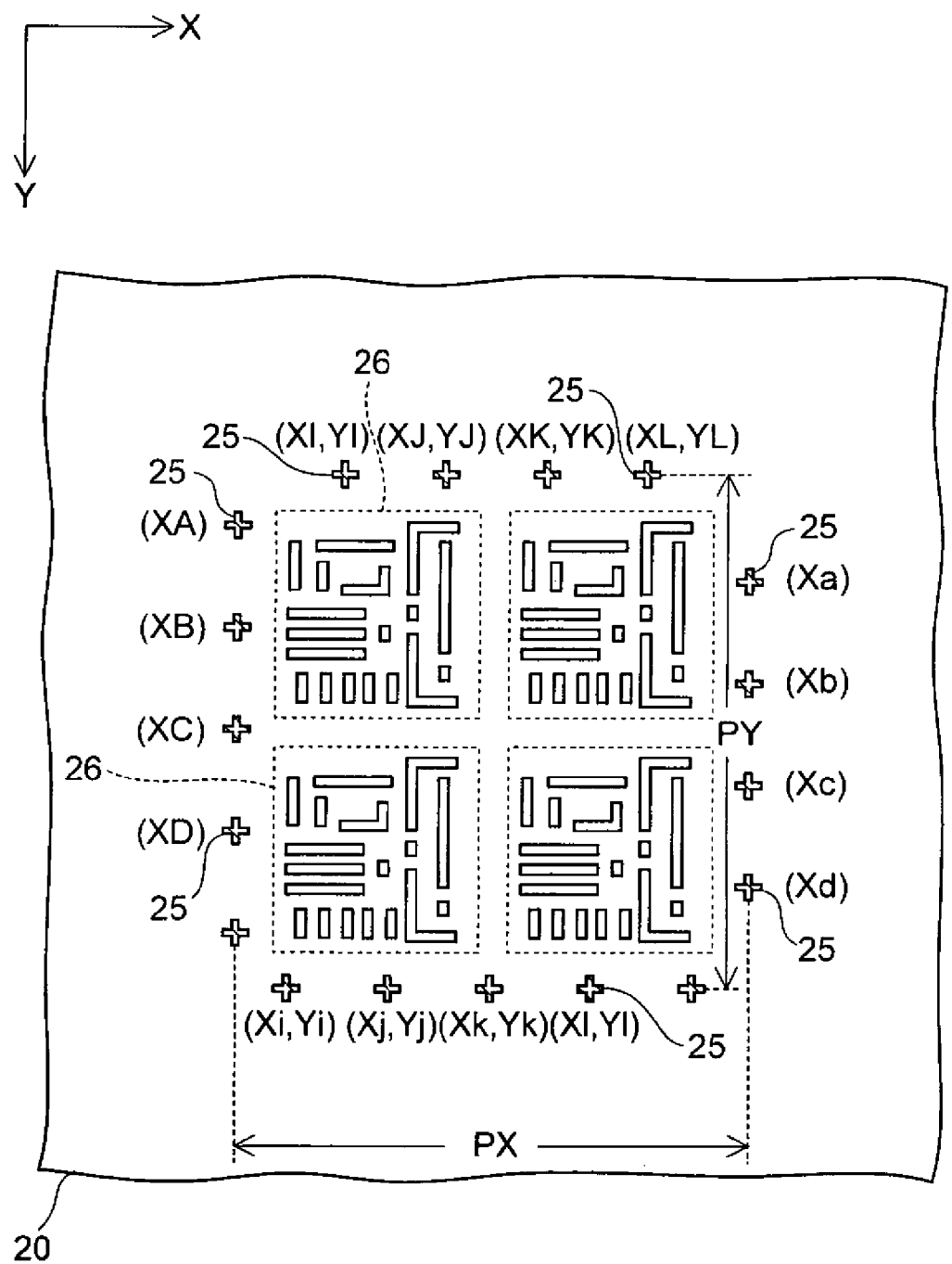
FIG. 22 is a plan view provided for explaining the checking method of a reticle.

FIG. 21 is a flowchart of a checking method of the reticle according to the present embodiment, and FIG. 22 is a plan view provided for explaining this checking method.

In this checking, it is judged whether the mask patterns 26 are arranged in designed positions in the following manner.

In order to perform the checking, coordinates of the reference points P of the respective inspection marks 25 are found (step S1) by irradiating the inspection marks 25 with laser light to measure reflection light in a commercially available reticle checking system. In an example of FIG. 22, X coordinates of the inspection marks 25 that are located in the left and right columns are denoted by XA to XD, and Xa to Xd, respectively. Additionally, coordinates of the inspection marks 25 that are located in the upper and lower rows are denoted by (XI,YI) to (XL,YL) and (Xi,Yi) to (Xl,Yl), respectively.

Note that how to set the reference points P of the inspection marks 25 is not particularly limited.

Figure 23:
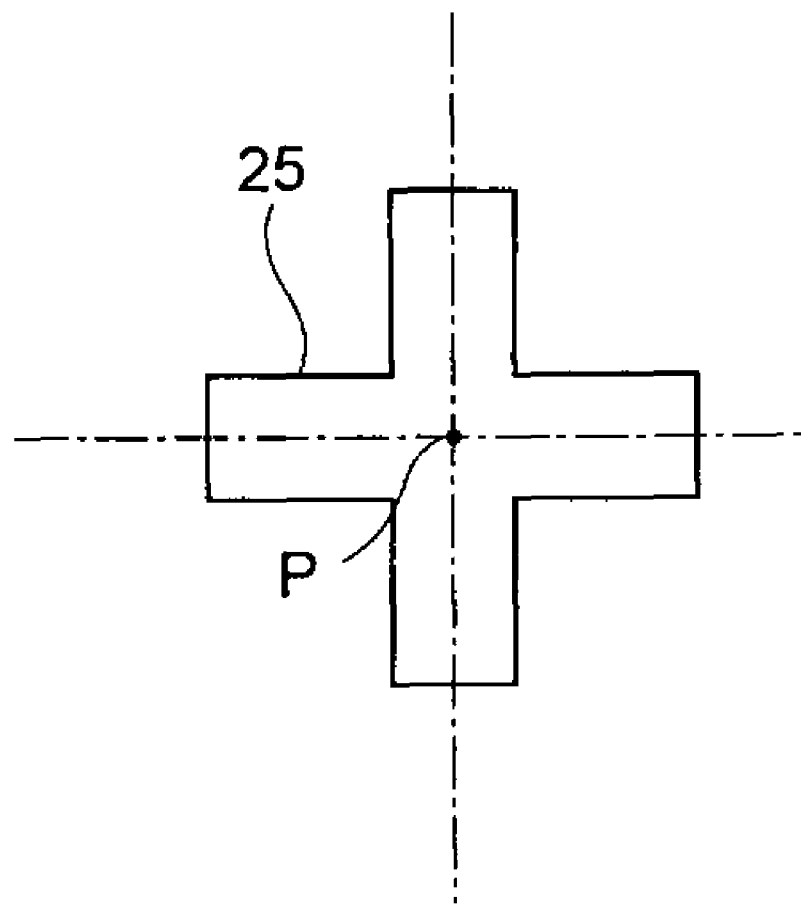
FIG. 23 is a plan view showing an example of reference points of the inspection marks.

FIG. 23 is a view showing one example of a position of the reference point P. In this example, a central point of the inspection mark 25 of cross shape is set as the reference point P.

Figure 24:
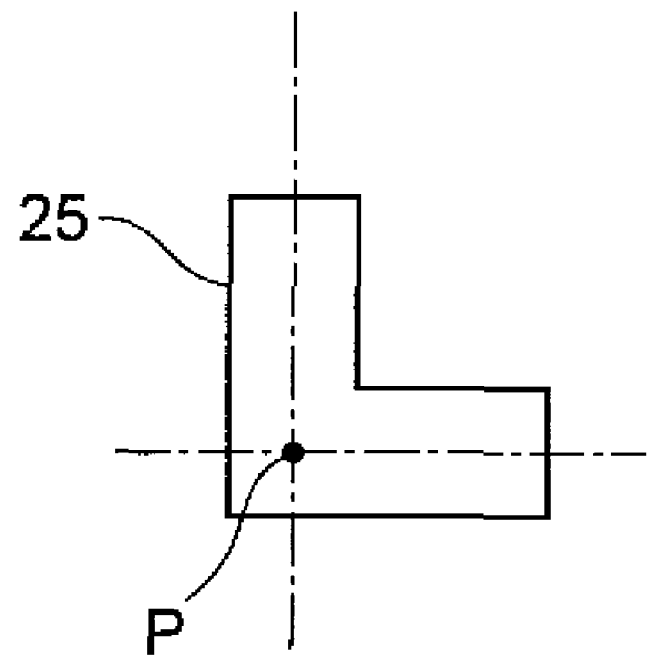
FIG. 24 is a plan view showing another example of reference points of the inspection marks.

Alternatively, as shown in FIG. 24, the inspection mark 25 may be formed in an L-shape, and a bending point thereof may be set as the reference point P.

Subsequently, based on the thus obtained coordinates of the inspection marks 25, (i) a shrinkage ratio ΔX in the X-axis direction, (ii) a shrinkage ratio ΔY in the Y-axis direction, and (iii) an orthogonal degree ΔO are calculated (step S2) as follows.

(i) Shrinkage Ratio in the X-Axis Direction

The shrinkage ratio ΔX in the X-axis direction is calculated by the following formula:

$$\Delta X=[[(Xa+Xb+Xc+Xd)-(XA+XB+XC+XD)]/4-PX]\times 1000000/PX\text{(ppm)},$$

where PX denotes a designed distance between each two of the reference points P of the inspection marks 25 in the X-axis direction, and is, for example, about 118 mm.

The shrinkage ratio ΔX obtained by this formula is one index used for judging how much the reticle 22 as a whole shrinks in the X-axis direction. When a value of the shrinkage ratio ΔX is zero, it is judged that the reticle 22 does not shrink in the X-axis direction.

(ii) Shrinkage Ratio ΔY in the Y-Axis Direction

The shrinkage ratio ΔY in the Y-axis direction is calculated by the following formula:

$$\Delta Y=[[(Yi+Yj+Yk+Yl)-(YI+YJ+YK+YL)]/4-PY]\times 1000000/PY\text{(ppm)},$$

where PY denotes a designed distance between each two of the reference points P of the inspection marks 25 in the Y-axis direction, and is, for example, about 138 mm.

The shrinkage ratio ΔY obtained by this formula is one index used for judging how much the reticle 22 as a whole shrinks in the Y-axis direction. When a value of the shrinkage ratio ΔY is zero, it is judged that the reticle 22 does not shrink in the Y-axis direction.

(iii) Orthogonal Degree ΔO

The orthogonal degree ΔO is an index indicating how much the sequence of the inspection marks inclines, and is calculated by the following formula:

$$\Delta O=[[(Xi+Xj+Xk+Xl)-(XI+XJ+XK+XL)]/4]\times 1000000/PY\text{(ppm)}.$$

When ΔO is zero, a sequence of the inspection marks 25 arranged in the X-axis direction, and a sequence of the inspection marks 25 arranged in the Y-axis direction are judged to be orthogonal to each other as designed.

Then, in step S2, it is checked whether the mask patterns 26 are arranged in the designed positions on the basis of these indices ΔX, ΔY and ΔO.

For example, when ΔX or ΔY is not zero, it is judged that the reticle 22 shrinks in the X-axis direction or in the Y-axis direction. Additionally, when ΔO is not zero, it is judged that a sequence of the mask patterns 26 in the X-axis direction or a sequence in the Y-axis direction is inclined.

As has been describe hereinabove, according to the present embodiments, because unexposed portions of a photoresist which correspond to inspection marks are deleted by double exposure, the photoresist does not remain in the outer peripheral scribe regions. Therefore, it is made possible to remove a film in the outer peripheral scribe region by etching. Thus, burrs attributable to the film remaining in the outer peripheral scribe region are not generated during the dicing, so that the number of defective chips can be reduced.

What is claimed is:

1. An exposure mask comprising:
   a transparent substrate;
   a light blocking zone formed on the transparent substrate;

a mask pattern formed inside a scribe region; and an inspection mark of a light-shielding pattern formed in a first side of the scribe region, wherein, a portion in a second side of the scribe region opposite to the first side and away from the inspection mark by a shot interval transmits an exposure light.

2. The exposure mask according to claim 1, wherein the light blocking zone is recessed from edges of the transparent substrate by a distance narrower than a width of the inspection mark.

3. The exposure mask according to claim 1, further comprising:

an aperture formed in the light blocking zone, and an alignment mark for an exposure system formed on the transparent substrate in a region inside the aperture.

4. The exposure mask according to claim 1, wherein the inspection mark is formed inside a virtual frame, and an another inspection mark is provided on the second side, the another inspection mark being obtained by rotating the virtual frame and the inspection mark therein by 180 degrees about a center of the virtual frame, and by subjecting the inspection mark to a parallel displacement to the second side.

5. The exposure mask according to claim 4, wherein the inspection mark is formed only in a one half region of the virtual frame.

6. A method of manufacturing an electronic device, comprising:

forming a film over a substrate;

forming a photoresist over the film;

performing a first exposure by using an exposure mask which includes a scribe region and an inspection mark of a light-shielding pattern formed in a first side of the scribe region; and performing a second exposure so that a region that is exposed to the first side in the first exposure is exposed to a second side of the scribe region which is opposite to the first side;

wherein, in the second exposure, an exposure light is incident on a region where the inspection mark is projected in the first exposure.

7. The method of manufacturing an electronic device according to claim 6, wherein the exposure mask has the first side of the scribe region and the second side of the scribe region opposite to the first side, and a portion away from the inspection mark by a shot interval transmits the exposure light.

8. The method of manufacturing an electronic device according to claim 6, wherein the shot region is surrounded by a light blocking zone.

9. The method of manufacturing an electronic device according to claim 6, further comprising:

forming a resist pattern by developing the photoresist after the second exposure;

forming a device pattern by etching the film while using the resist pattern as a mask;

removing the resist pattern; and cutting out a plurality of chips from the substrate by dicing the substrate along the scribe region.

10. The method of manufacturing an electronic device according to claim 6, further comprising:

irradiating the photoresist with a light along a rim of the substrate.

11. The method of manufacturing an electronic device according to claim 6, wherein in the first exposure or in the second exposure, the photoresist is exposed so that a part of a projected image of the mask pattern overreaches the substrate.

12. A method of inspecting an exposure mask, comprising:

finding position coordinates of a plurality of inspection marks of a light-shielding pattern formed on a first side of a scribe region that is made by fringing a shot region on a transparent substrate which is provided to an exposure mask; and judging, by using the position coordinates, whether mask patterns formed on the transparent substrate inside the scribe region are arranged in designed positions, wherein the exposure mask includes a light blocking zone formed on the transparent substrate and surrounding the shot region, wherein a portion in a second side of the scribe region opposite to the first side and away from the inspection mark by a shot interval transmits an exposure light.

13. The method of inspecting an exposure mask according to claim 12, wherein, in judging the mask pattern, any one of a shrinkage of the mask patterns and an inclination of a sequence of the inspection marks is inspected.

14. The method of inspecting an exposure mask according to claim 12, wherein, as the position coordinates of the inspection marks, position coordinates of reference points of the inspection marks are used.

* * * * *